US008866078B2

(12) United States Patent  (10) Patent No.: US 8,866,078 B2
Akima et al.  (45) Date of Patent: Oct. 21, 2014

(54) SCANNING TRANSMISSION TYPE ELECTRON MICROSCOPE

(75) Inventors: Hisanao Akima, Ranzan (JP); Takaho Yoshida, Higashimurayama (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 13/806,805

(22) PCT Filed: May 16, 2011

(86) PCT No.: PCT/JP2011/061232
§ 371 (c)(1),
(2), (4) Date: Dec. 24, 2012

(87) PCT Pub. No.: WO2012/005056
PCT Pub. Date: Jan. 12, 2012

(65) Prior Publication Data
US 2013/0099117 A1  Apr. 25, 2013

(30) Foreign Application Priority Data
Jul. 5, 2010  (JP) .................................. 2010-152964

(51) Int. Cl.
H01J 37/26  (2006.01)
H01J 37/153  (2006.01)
H01J 37/28  (2006.01)

(52) U.S. Cl.
CPC ......... H01J 37/261 (2013.01); *H01J 2237/216* (2013.01); H01J 37/153 (2013.01); *H01J 2237/1534* (2013.01); *H01J 2237/2826* (2013.01); H01J 37/28 (2013.01)
USPC .............................. 250/311; 250/306; 250/310

(58) Field of Classification Search
USPC .......... 250/306, 307, 309, 310, 311; 430/296; 702/134
See application file for complete search history.

(56) References Cited

U.S. PATENT DOCUMENTS

2007/0120055 A1* 5/2007 Sawada et al. ................ 250/307

FOREIGN PATENT DOCUMENTS

| JP | 2007-179753 | 7/2007 |
| JP | 2007-180013 | 7/2007 |
| JP | 2007-266008 | 10/2007 |
| JP | 2008-130264 | 6/2008 |
| JP | 2009-218079 | 9/2009 |
| WO | WO 99/13490 A1 | 3/1999 |

* cited by examiner

*Primary Examiner* — Nicole Ippolito
(74) *Attorney, Agent, or Firm* — Antonelli, Terry, Stout & Kraus, LLP

(57) ABSTRACT

Disclosed is a scanning transmission type electron microscope provided with a scanning transmission electron microscope provided with an aberration corrector 805 for correcting the aberration of an electron-optical system that irradiates electron beams to a sample (808); a bright field image detector (813) for detecting electron beams that have transmitted through the sample; a camera (814); and an information processing apparatus (703) for processing signals detected by the detectors. The information processing apparatus divides a Ronchigram obtained by the detectors into a plurality of areas, and calculates a feature vector (W; 903), which reflects the magnitude and direction of an on-axis secondary comma aberration (B2), from the values of an off-axis defocus {C1 (τ)} to be obtained for each of the plurality of areas, and the distance (τ) from the center of the Ronchigram to the center of the plurality of areas, and also calculates the correcting condition for the on-axis secondary comma aberration with the feature vector. In such a way, a scanning transmission type electron microscope that can correct he on-axis secondary comma aberration thereof in a short period of time, and efficiently, was able to be provided.

10 Claims, 12 Drawing Sheets

X0  X1  X2  X3  X4
    INITIAL      MINIMUM X
    STATE        COMPONENT

Y0 (=X3)  Y1  Y2  Y3  Y4  Y5
                          MINIMUM Y
                          COMPONENT

SCANNING TRANSMISSION TYPE ELECTRON MICROSCOPE

TECHNICAL FIELD

The invention relates to a scanning transmission electron microscope provided with an aberration corrector.

BACKGROUND TECHNOLOGY

With a scanning transmission electron microscope (STEM), the smaller a diameter of an electron beam (a probe) scanning over a specimen is, the higher resolution as obtained is. A probe diameter is limited owing to the aberration of an electron-optical system; however, an apparatus with an aberration corrector mounted therein has lately been developed.

In general, an aberration corrector configures a plurality of multipole lenses, and a plurality of round electromagnetic lenses. Aberrations are measured by use of any method at the time when the aberration corrector is activated, and the respective lenses are provided with feedback in such away as to reduce the respective aberrations. For example, Patent Document 1 discloses a method for Fourier analysis of an autocorrelation function from segmented areas of a Ronchigram, as a method for measuring aberrations. Further, for example, Patent Document 2 discloses a method for measuring aberrations.

CITATION LIST

Patent Literature

Patent Document 1: Japanese Unexamined Patent Application Publication No. 2007-180013
Patent Document 2: Japanese Unexamined Patent Application Publication No. 2007-266008

SUMMARY OF INVENTION

Technical Problem

Various methods for measuring aberrations, other than the method disclosed in Patent Document 1, have been devised, and most of the methods, including one in Patent Document 1, require a plurality of electron microscope images that are acquired by varying an illumination angle of an electron beam, and a focus. And, the major portion of time for measuring aberrations is occupied by time for acquiring the plurality of the electron microscope images.

In the initial stage of correction of an aberration having a large residual low-order aberration in the electron-optical system, a user of an apparatus, therefore, executes correction of a low-order aberration by visual check of a microscope image without relying on aberration measurement requiring time ranging from several seconds to several minutes. This correction of the low-order aberration by the visual check is executed mainly as to a first-order axial astigmatism $A1$, and a second-order axial coma aberration $B2$.

In the correction of the first-order axial astigmatism $A1$, a shape of a Fourier transform pattern of an electron microscope image acquired from an amorphous sample, and a distorted pattern seen in the vicinity of the center of a Ronchigram acquired by use of an appropriate sample will serve as guidelines. In these guidelines, the absolute value of $A1$ can be determined with relative ease from the Fourier transform pattern, and circularity of distortion.

On the other hand, in the correction of the second-order axial comma aberration $B2$, a degree of tilt in distortion of the Ronchigram will serve as guidelines, however, a degree of skill is required in making a determination thereon, so that there exists a problem that correction as efficient as in the case of $A1$ cannot be executed.

It is therefore an object of the invention to provide a scanning transmission electron microscope capable of efficiently correcting a second-order axial comma aberration in a short time.

Solution to Problem

In order to solve the problem described as above, with the present invention, the Ronchigram is divided into a plurality of segmented areas, and a correction condition of the second-order axial comma aberration is found on the basis of a feature vector calculated from center position coordinate vectors of the respective segmented areas, and an off-axial defocus at relevant position coordinates.

Advantageous Effects of Invention

With the present invention, because the feature vector can be calculated from one sheet of Ronchigram acquired at a focus, the correction condition of the second-order axial comma aberration can be presented to a user of an apparatus via GUI immediately after the acquisition of the Ronchigram (within one second). As a result, it is possible to efficiently execute the correction of the second-order axial comma aberration in a short time.

BRIEF DESCRIPTION OF DRAWINGS

FIG. 5 shows a view showing one example in which an approximation value of an off-axial defocus is calculated from a Ronchigram, in which (a-1) shows one example of a Ronchigram using an amorphous sample, (a-2) shows one example in which an area around the center of the Ronchigram shown in (a-1) is divided into a plurality of segmented areas in a grid pattern, indicating an ellipse expressing autocorrelation functions worked out on the respective segmented areas, and a contour line thereof, (b-1) shows one example of a Ronchigram using a particulate sample, and (b-2) shows one example in which an area around the center of the Ronchigram shown in (b-1) is divided into a plurality of segmented areas in a grid pattern, indicating an ellipse expressing a contour line of image intensity on the respective segmented areas;

DESCRIPTION OF EMBODIMENTS

Embodiments of the invention are hereinafter described.

First Embodiment

Figure 1:
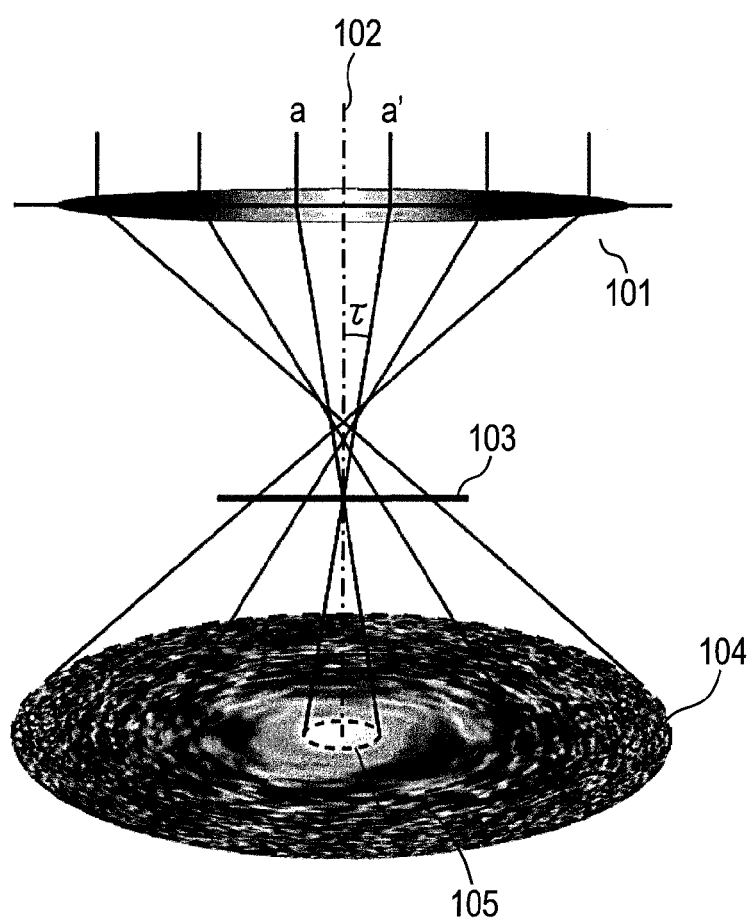
FIG. 1 is a schematic diagram showing optical systems present on the periphery of a sample at the time of acquiring a Ronchigram.
Figure 2A:
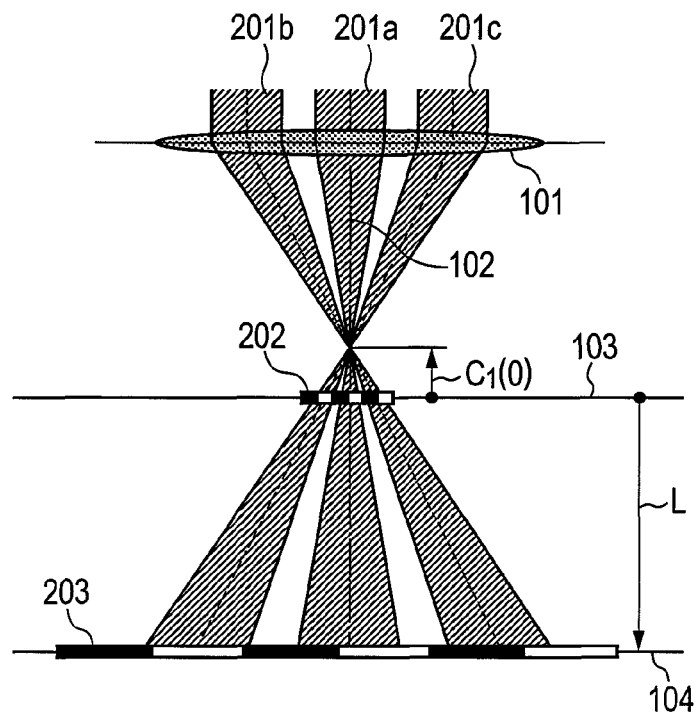
FIG. 2 shows a relationship between magnification of the Ronchigram and a defocus, in which (a) shows an optical system without an aberration, and (b) shows an optical system with an aberration.
Figure 2B:
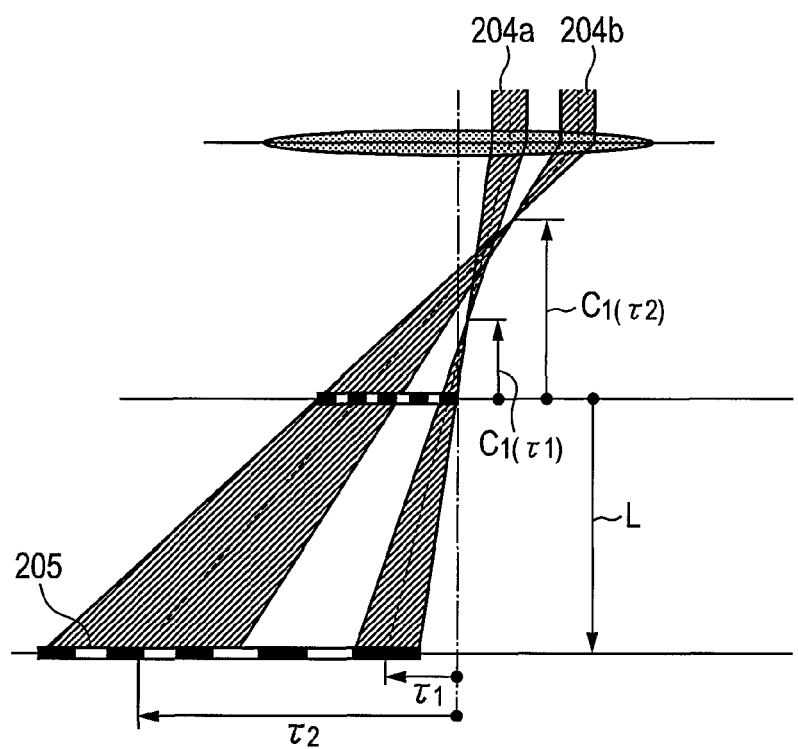

A first embodiment of the invention is described with reference to the accompanied drawings. First, a method for acquiring a Ronchigram, according to the present embodiment, is described with reference to FIG. 1. The Ronchigram is an image observed on the underside of a sample in the case where scanning by an electron beam is stopped without an aperture or with a large aperture. The image has magnification varying position by position, and contains aberration information. FIG. 1 is a schematic diagram showing optical systems on the periphery of a sample at the time when the Ronchigram is acquired in a transmission electron microscope/a scanning transmission electron microscope. For brevity, only a three-order spherical aberration is considered as an aberration.

In FIG. 1, reference sign 101 denotes an objective condenser lens, 102 an optical axis of an electron beam falling on the objective condenser lens 101, 103 a sample plane with a sample placed thereon, and 104 an image plane where the Ronchigram is observed (depicted so as to show a depth thereof). Normally, adjustment is made such that the center axis of the objective condenser lens 101 is aligned with the optical axis 102.

An angle formed between the optical axis 102 and the electron beam after a track thereof is bent by the agency of the objective condenser lens 101 is defined as a convergence angle τ. A height at which focusing is achieved varies for every convergence angle, that is, for every electron beam passing through a point at a varying distance from the center axis of the objective condenser lens 101 due to an effect of an aberration. Assuming that a distance between the sample plane 103 and the image plane 104, as measured along the optical axis 102, is constant, magnification of an image projected onto the image plane 104 represents a function of a distance between the height at which focusing is achieved and the sample plane 103, so that the Ronchigram becomes a distorted image having magnifications varying on a position-by-position basis. If all the electron beams passing through respective positions closer to the optical axis 102 than those for the electron beams a to a', respectively, shown in FIG. 1, are focused on the sample plane 103, a flat contrast area 105 corresponding with an image having an infinite magnification is observed inside the Ronchigram.

Because position-coordinates on the Ronchigram correspond with the convergence angle τ, as shown in FIG. 1, a position-coordinate vector is displayed hereinafter by use of a complex number τ=t×exp (iφ). More specifically, when the Ronchigram is disposed on two-dimensional Cartesian coordinates, an X-coordinate is given as the real part of τ, Re [τ]=t×cos (φ), and a Y-coordinate is given as the imaginary part of τ, Im [τ]=t×sin (φ).

Next, referring to FIGS. 2(*a*), 2(*b*), respectively, a relationship between the magnification of the Ronchigram and a defocus is described hereinafter. FIG. 2(*a*) shows an optical system without an aberration. Herein, suppose electron beams 201*a*, 201*b*, 201*c*, as shown in FIG. 2(*a*), and a (virtual) sample 202 with stripes spaced at equal intervals. Any of the electron beams is focused at a position away by C1(0) from a sample plane 103, and magnification M of a projection image 203 on an image plane 104 will be uniformly M={C1(0)+L}/C1(0). That is, the sample is uniformly expanded, and the stripes remain in such a state as spaced at the equal intervals.

FIG. 2(*b*) shows an optical system with a third-order spherical aberration. Supposing the case of electron beams 204*a*, 204*b*, as shown in FIG. 2(*b*), a height at which the electron beams each are focused represents a function of a convergence angle (=position coordinates on the Ronchigram), the function being called an off-axial defocus C1 (τ1). Because C1 (τ1)<C1 (τ2), as shown in FIG. 2(*b*), a relationship between magnification M1 [={C1(O)+L}/C1(τ1)] of the projection image of the electron beam 204*a* and magnification M2 [={C1(O)+L}/C1(τ2)] of the projection image of the electron beam 204*b* will become M1>M2. More specifically, intervals between stripes of a projection image 205 are not uniform.

Figure 3A:
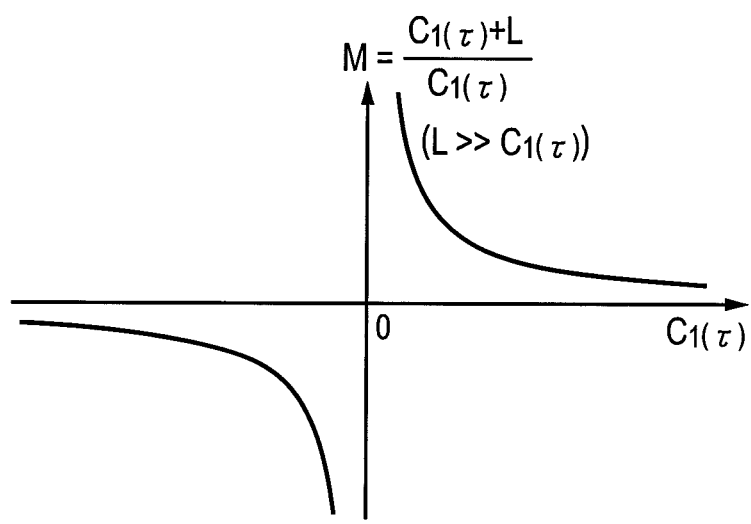
FIG. 3 is a view showing variation in magnification, in relation to a defocus, in which (a) shows a relationship between magnification and an off-axial defocus, and (b) shows a relationship between the reciprocal of magnification and the off-axial defocus.

Thus, with the Ronchigram, magnification M varies on a position-by-position basis, and M is dependent on the off-axial defocus C1(τ), and a distance L between the sample plane and the image plane. Herein, the distance L is dependent on the magnification of a projection lens disposed between the sample plane and the image plane, and normally the following holds: L>>C1 (τ). FIG. 3(*a*) shows a relationship between C1(τ) and M, and FIG. 3(*b*) shows a relationship between C1(τ) and $M^{-1}$. Variation in M, against C1(τ), is an inverse function of C1(τ), as shown in FIG. 3(*a*), while variation in $M^{-1}$, against C1(τ), is a proportional function of C1(τ), as shown in FIG. 3(*b*).

Next, there is described the principle behind an operation for finding a feature vector of the second-order axial comma aberration from the position-coordinates vector τ, on the Ronchigram, and an off-axial defocus C1(τ) at the relevant position-coordinates. C1(τ) is expressed by use of axial(τ=0) aberration coefficient, and in the case of considering up to five-order as axial aberration coefficient, C1(τ) can be represented by expression (1) as follows:

$$C1(\tau) = C_1 + 2(B_2\tau^* + B_2^*\tau) + 2C_3|\tau|^2 + \qquad (1)$$
$$3(S_3\tau^{*2} + S_3^*\tau^2) + 6|\tau|^2(B_4\tau^* + B_4^*\tau) + 4(D_4\tau^{*3} + D_4^*\tau^3) +$$
$$3C_5|\tau|^4 + 8|\tau|^2(S_5\tau^{*2} + S_5^*\tau^2) + 5(R_5\tau^{*4} + R_5^*\tau^4)$$

Figure 4A:
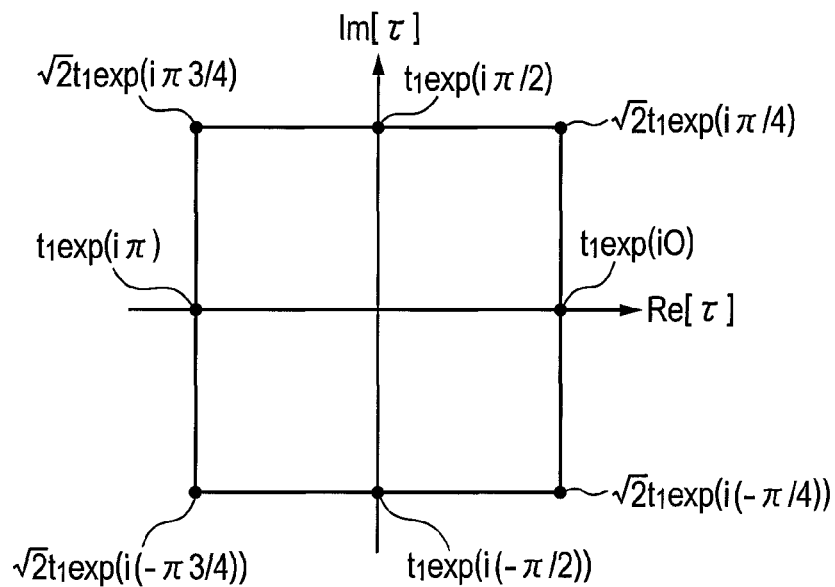
FIG. 4 is a view showing one example of position coordinates on the Ronchigram, for use in calculation of a feature vector, in which (a) shows the case of a rectangular layout, and (b) shows the case of a circular layout.
Figure 4B:
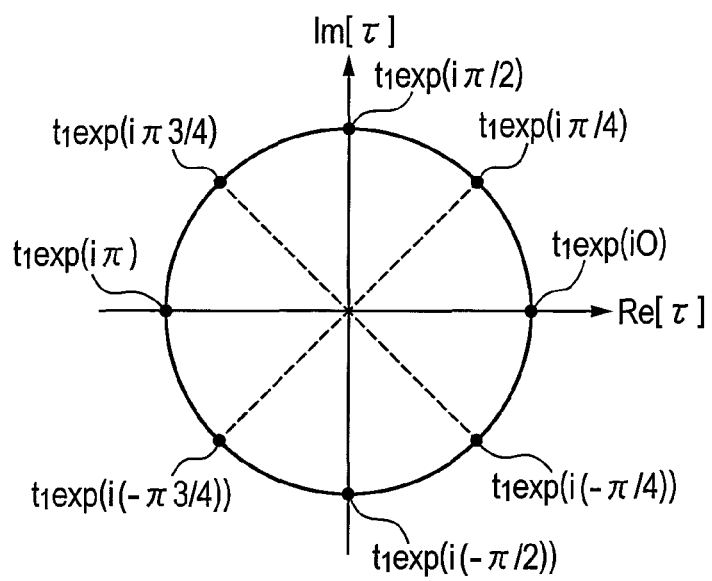

In this connection, as for reference signs on the right-hand side of the Expression (1), C1 refers to an axial defocus, B2 a second-order axial comma aberration, C3 a three-order spherical aberration, S3 a third-order star aberration, B4 a fourth-order axial comma aberration, D4 a fourth-order three lobe aberration, C5 a three-order spherical aberration, S5 a five-order spherical aberration, and R5 a fifth-order rosette aberration. Reference sign * represents a conjugate complex number. Herein, as shown in FIG. 4(a) (in the case of a rectangular layout) and FIG. 4(b) (in the case of a circular layout), respectively, if set S of $\tau=\{\tau|\forall\tau\epsilon S(\exists-\tau\epsilon S)\}$ where there exists a position-coordinate vector $-\tau(=t\times\exp\{(i(\phi+\pi))$ positioned at a point symmetric with an optional position-coordinate vector $\tau$(on the Ronchigram)=$t\times\exp(i\phi)(-\pi\leq\phi\leq\pi)$ about a point with respect to the center of Ronchigram, a composite vector $W\equiv_{\tau\epsilon S}\{\tau\times C1(\tau)\}$, as defined from the product of the convergence angle $\tau$ and the off-axial defocus $C1(\tau 1)$, is represented as follows:

In the case of the rectangular layout, as shown in FIG. 4(a), $$24B_2 t_1^2 + 24(5B_4 - 2D_4^*) t_1^4 \quad (2)$$

In the case of the circular layout, as shown in FIG. 4 (b), the composite vector is represented as follows:

$$16B_2 t_1^2 + 48B_4 t_1^4 \quad (3)$$

Herein, the second term of the expression (2) as well as the expression (3) can be neglected by selecting a minute quantity as $t_1$, whereupon there remains the first term including the second-order axial comma aberration B2. More specifically, the feature vector W calculated on the segmented area in the vicinity of the center of the Ronchigram is the feature vector reflecting the second-order axial comma aberration B2.

Figure 3B:
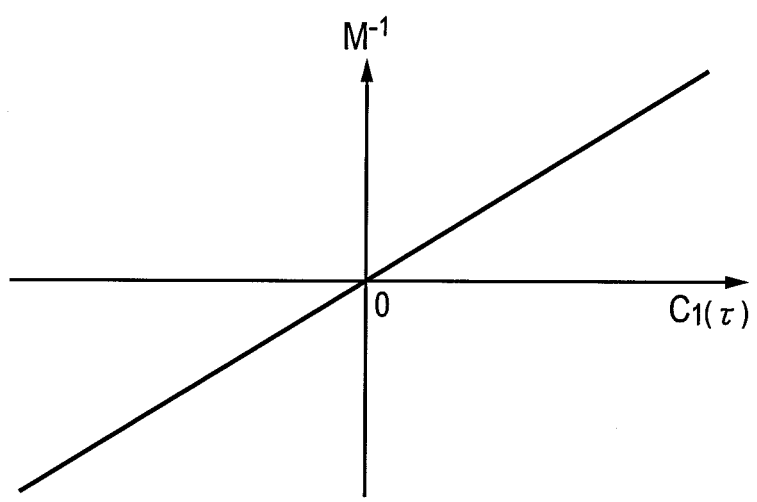

In order to accurately find the off-axial defocus $C1(\tau)$, it is necessary to carry out the known aberration measurement method for making use of the plurality of the electron microscope images acquired by varying the illumination angle of an electron beam and the focus; however, using a relationship that the reciprocal of the localized magnification of the Ronchigram is proportional to the off-axial defocus $C1(\tau)$ as shown in FIG. 3(b) enables finding an approximation value of the off-axial defocus $C1(\tau)$ by extraction of magnification information from a localized segmented area of the Ronchigram.

Figures 1, 5A:
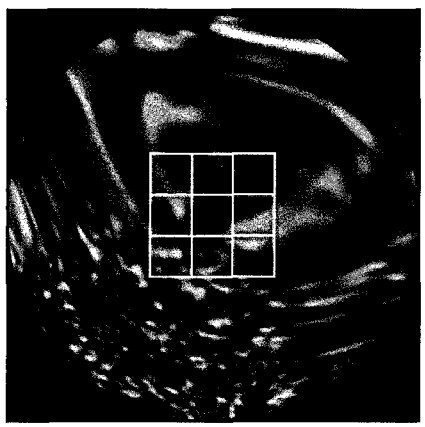
Figures 2, 5A:
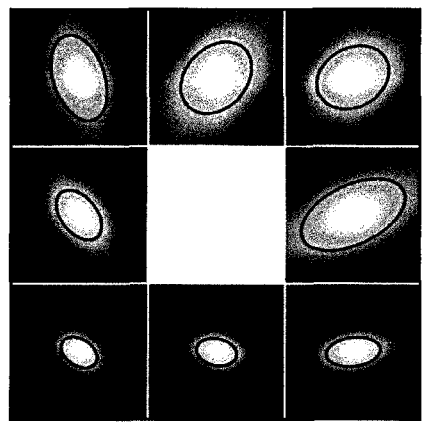

FIG. 5(a) shows an example where an approximation value of an off-axial defocus C1 ($\tau$) is calculated from a Ronchigram acquired by use of an amorphous sample. An area in the vicinity of the center of the Ronchigram is divided into a plurality of segmented areas in a grid pattern, as shown in FIG. 5(a-1), and an autocorrelation function is calculated in respect of each of the segmented areas, as shown in FIG. 5(a-2). If an area of an ellipse expressing a contour line in an intensity distribution of the autocorrelation function is defined as $\sigma$, $\sigma^{-1/2}$ is the approximation value of the off-axial defocus C1 in a relevant segmented area. Further, in this case, the plural segmented areas are disposed in a rectangular layout, however, if the plural segmented areas are disposed such that the sum of X-components, and the sum of Y-components, with respect to the center coordinates of each of the plural segmented areas, respectively, become zero, this will be sufficient.

Accordingly, while the plural segmented areas in FIG. 5(a-1) form a 3×3 matrix area, excluding the center, (8 segmented areas in all), the plural segmented areas can also be varied to form, for example, a 4×4 matrix area, excluding a 2×2 matrix area at the center, (12 segmented areas in all). Further, an increase in the number of the segmented areas will result in enhancement in azimuth precision. However, the layout, of the 3×3 matrix area, excluding the center, that is, the 8 segmented areas are practical in respect of the number of the segmented areas because those segmented areas are located in the vicinity of the center.

Figures 1, 5B:
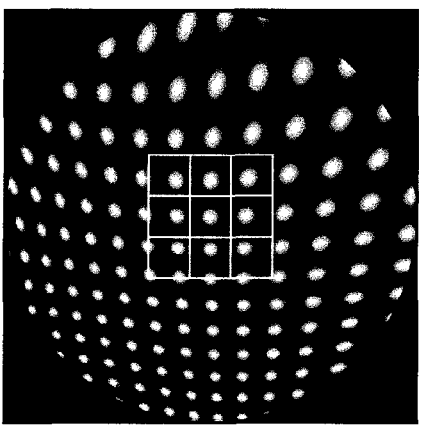
Figures 2, 5B:
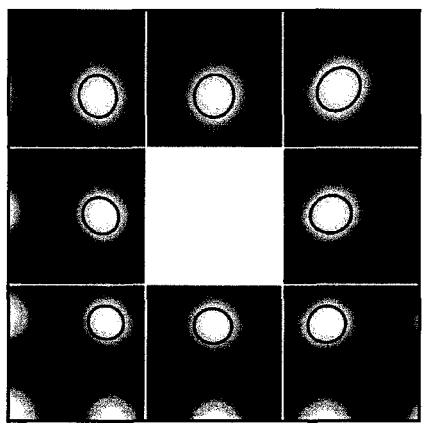

FIG. 5(b) shows an example in which the approximation value of the off-axial defocus $C1(\tau)$ is calculated from a Ronchigram acquired by use of a particulate sample. An area in the vicinity of the center of the Ronchigram is divided into a plurality of segmented areas in a grid pattern, as shown in FIG. 5(b-1), and an area of an ellipse expressing a contour line in image intensity is extracted as shown in FIG. 5(b-2). If the area of the pellipse is defined as $\rho$, $\rho^{-1/2}$ is the approximation value of the off-axial defocus C1 in a relevant region. Further, variation in particulate size is preferably falls within ±10% (3$\sigma$)

The respective off-axial defocuses $C1(\tau)$ obtained by the methods described as above are meaningful only as a relative value between the divided segmented areas with each other, and an absolute value is on an optional scale, which is sufficient for attainment of an object of the present invention. Because the feature vector W found from the off-axial defocus $C1(\tau)$ corresponds to a gravitational center vector when the absolute value of the off-axial defocus $C1(\tau)$ is regarded as a load, and information on B2 is reflected in the degree of the tilt of the off-axial defocus $C1(\tau)$. More specifically, only if the relative value of the off-axial defocus $C1(\tau)$ is correct, a direction of the feature vector W will be in alignment with a direction of the second-order axial comma aberration B2. It need only be sufficient to calibrate the absolute value of the feature vector W for every method of finding the off-axial defocus $C1(\tau)$.

Figure 6:
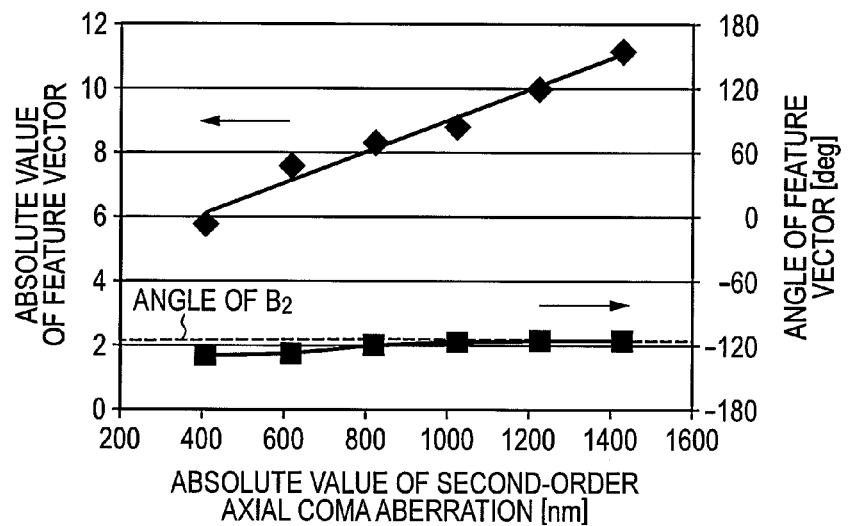
FIG. 6 is a view showing one example in which a relationship between second-order axial comma aberration and a feature vector is examined; second-order axial comma aberration

FIG. 6 shows one example in which a relationship between the feature vector W and the second-order axial comma aberration B2 is examined. This is a view showing the relationship resulting from calculation by assuming t1=10 mrad on the coordinates of FIG. 4(a) from a simulation image of the Ronchigram, acquired from an amorphous sample, when the absolute value of the second-order axial comma aberration B2 is increased with an angle of the second-order axial comma aberration B2, kept constant (-114 degrees).

An angle of the feature vector W is at -120±6 degrees, being substantially in agreement with the angle of the second-order axial comma aberration B2. Further, there is observed a proportional relationship between the absolute value of the second-order axial comma aberration B2 and the absolute value of the feature vector W. Accordingly, if the angle of the feature vector W is regarded as the angle of the second-order axial comma aberration B2, and the proportional relationship between the absolute value of the second-order axial comma aberration B2 and the absolute value of the feature vector W is calibrated beforehand, a correction condition of the second-order axial comma aberration B2 can be worked out from the feature vector W.

Figure 7:
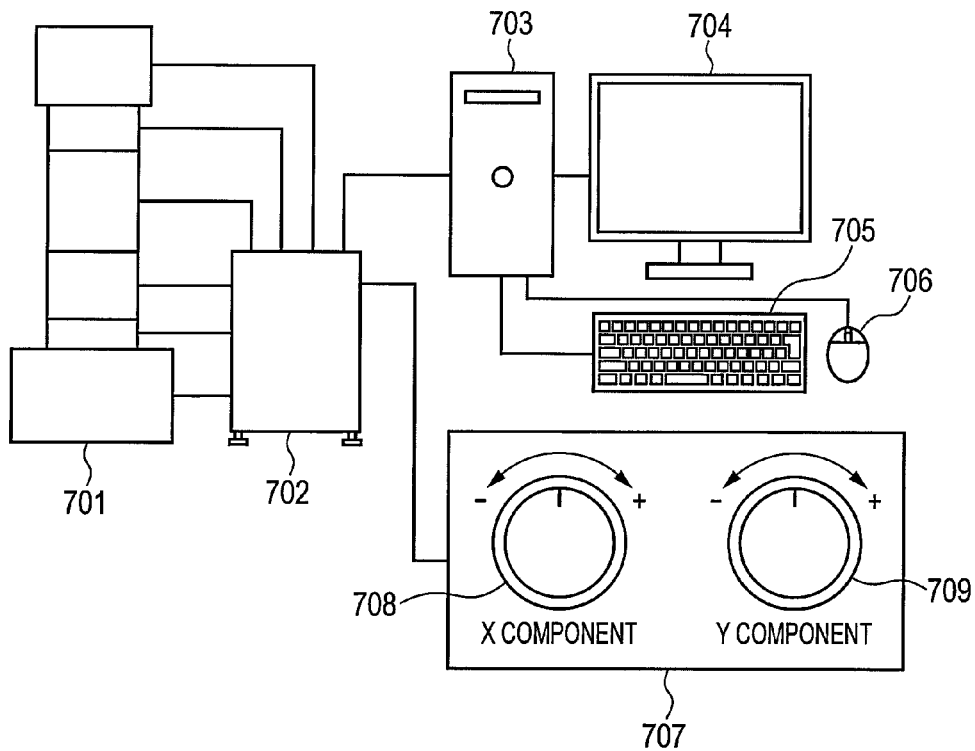
FIG. 7 is a view showing an external configuration of a scanning transmission electron microscope according to a first embodiment of the invention.

Next, there is described an example of a configuration of an apparatus for finding the feature vector W from the Ronchigram that has been acquired. FIG. 7 shows an external configuration of a scanning transmission electron microscope according to the present embodiment. The apparatus is made up mainly of a column 701, a control unit 702, an information processing unit 703, and a display 704. An input means (for example, a keyboard 705, a mouse 706) for receiving an input of a user is connected to the information processing unit 703. Further, a console 707 for correction of the second-order axial comma aberration B2 is connected to the control unit 702. Techniques themselves for correction of the second-order axial comma aberration B2 are well known, and are described in, for example, Patent Document 2. With the use of these methods, the X-component of B2, and the Y-component of B2 can be corrected via an X-component adjusting knob 708, and a Y-component adjusting knob 709, respectively. In this connection, the console 707 may be virtually realized with the use of GUI (Graphical User Interface) shown on the display 704.

Figure 8:
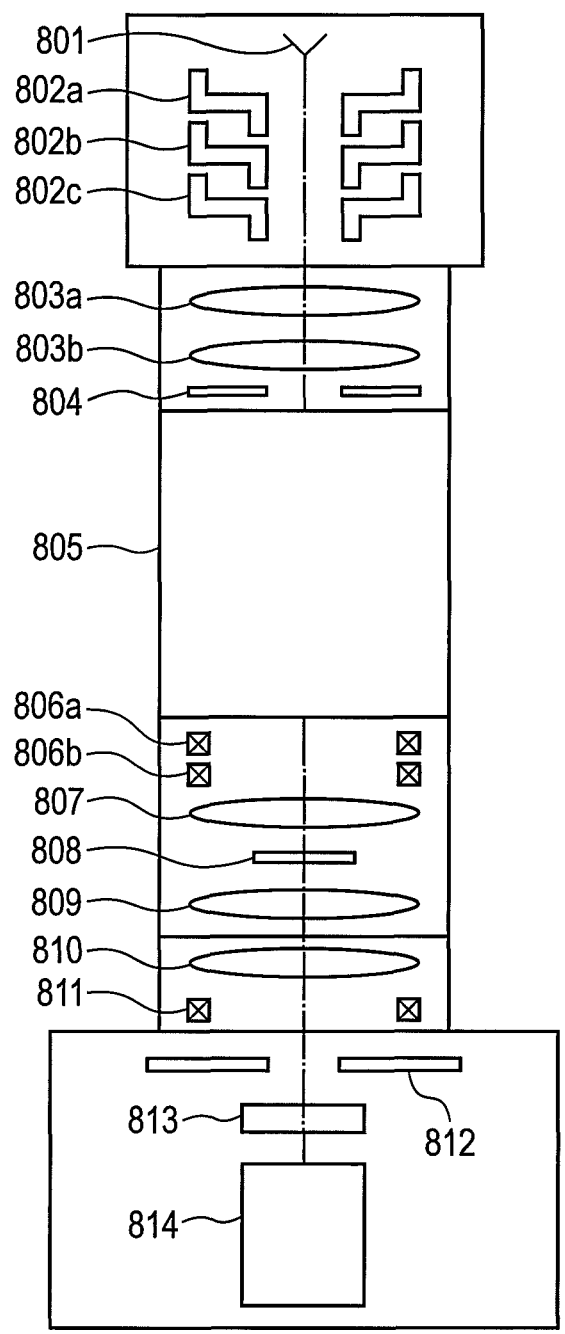
FIG. 8 is a view showing an internal configuration of a column of the scanning transmission electron microscope of FIG. 7.

FIG. 8 shows an internal configuration of the column 701 of the scanning transmission electron microscope that is shown in FIG. 7. An electron beam emitted from an electron beam source 801 is accelerated up to a predetermined accelerating voltage by respective electric lenses 802a, 802b, and 802c. The electron beam accelerated up to the predetermined accelerating voltage is scaled down by condenser lenses 803a, 803b. The electron beam having passed through a condenser aperture 804 underneath the condenser lens 803b further passes through an aberration corrector 805, whereupon aberrations including a spherical aberration are corrected. The aberration corrector 805 itself is well known, and configures both multipole lenses, and round lenses, in multiple stages, and a deflector coil, so that a correction value of an aberration can be adjusted by controlling respective poles of the multipole lens, and an excitation current of the round lenses.

The electron beam having passed through the aberration corrector 805 is converged on a sample 808 by an objective condenser lens 807, thereby forming a probe. The electron beam having transmitted through the sample 808 to be scattered forms an electron diffraction image on the underside of the sample 808 by the agency of an objective imaging lens 809, and the electron diffraction image is projected on a camera 814 by a projection lens 810. At the time of picking up a dark field image or a bright field image, an electron beam probe is caused to scan over the sample by use of scan coils 806a, 806b, underneath the aberration corrector 805, respectively, thereby acquiring a signal at a dark field image detector 812 or a bright field image detector 813, in sync with scanning, by luminance modulation according to image intensity.

An alignment coil 811 provided underneath the projection lens 810 is for use in axial alignment with respect to the dark field image detector 812, the bright field image detector 813, and the camera 814. Because the bright field image detector 813 is installed on the optical axis, there is provided a movable mechanism whereby the bright field image detector 813 can be removed from over the optical axis at the time when the camera 814 is used.

In a series of steps, all the lenses, the coils, and the detectors are controlled via the control unit 702, and an operator can set a condition through a user interface such as the display 704, the keyboard 705, the mouse 706, and so forth.

Figure 9:
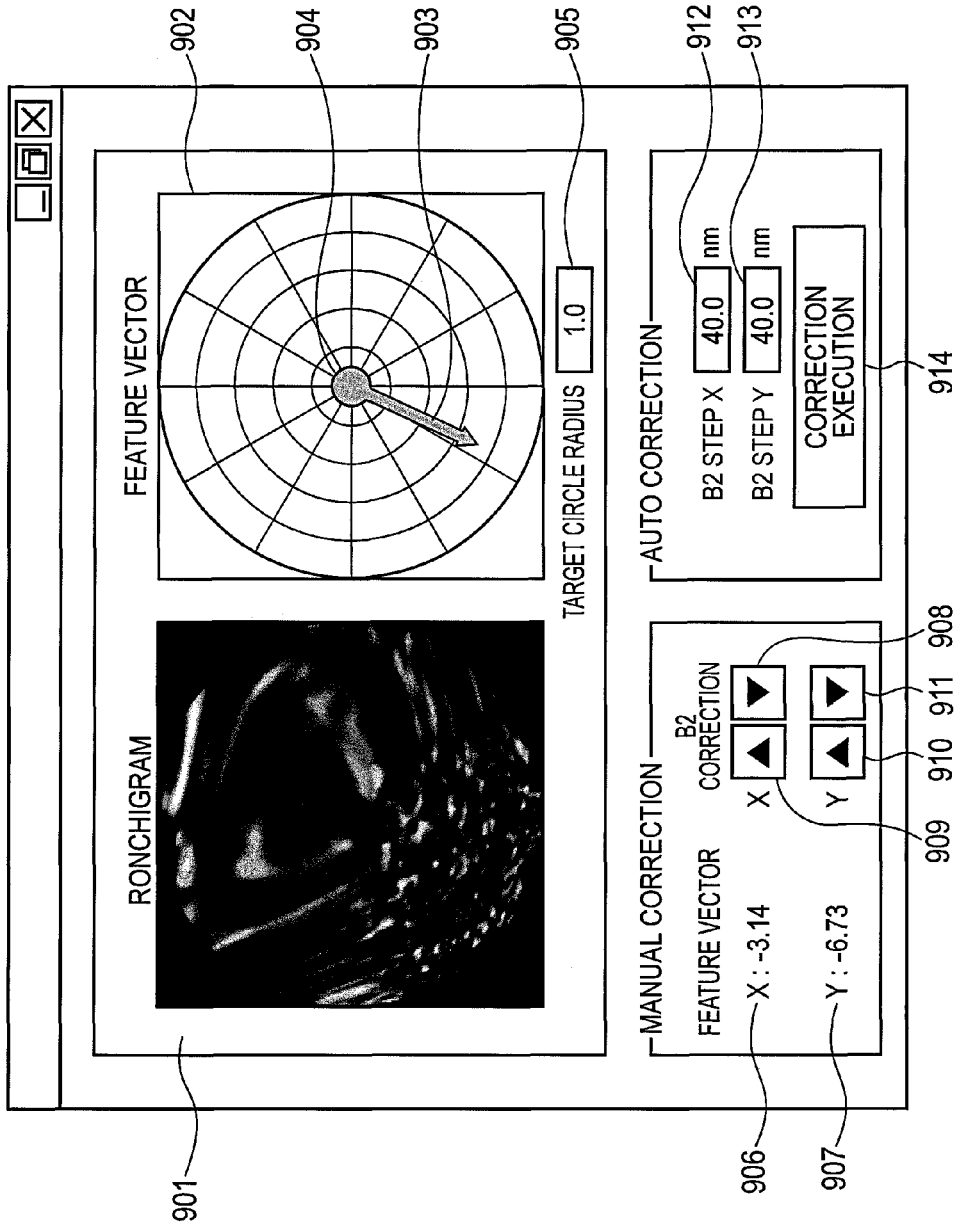
FIG. 9 is a view showing one example GUI used at the time of correcting the second-order axial comma aberration in the scanning transmission electron microscope of FIG. 7.

FIG. 9 shows one example of GUI at the time of correcting the second-order axial comma aberration B2. First, there are described techniques for manually correcting the second-order axial comma aberration B2 by use of the present GUI. A user of the apparatus executes adjustment such that a feature vector 903 can fall within a target circle 904 by use of a button 908 for the X-component of B2 toward the + direction, a button 909 for the X-component of B2 toward the − direction, a button 910 for the Y-component of B2 toward the + direction, and a button 911 for the Y-component of B2 toward the − direction, or by use of the X-component adjusting knob 708, and the Y-component adjusting knob 709, having functions equivalent to the former, respectively, while looking at the feature vector 903 displayed on a feature vector view 902, label 906 which shows the X-component of the feature vector 903, and label 907 which shows the Y-component thereof. If the color of the feature vector 903 is varied to be subsequently displayed depending on whether or not the feature vector 903 is within the target circle 904 at this point in time, the success or failure of adjustment can be visually clarified. Further, the size of the target circle 904 can be freely set via a text box 905 for setting a target circle radius. The result of adjustment is immediately (within one second) reflected on a Ronchigram display 901, a feature vector display 902, label 906 which shows the X-component of the feature vector, and label 907 which shows the Y-component thereof, so that the user of the apparatus can execute the correction of the second-order axial comma aberration B2 while checking an effect of the adjustment. That is, with the use of the feature vector, efficient correction of the second-order axial comma aberration is enabled.

Next, techniques for automatically correcting the second-order axial comma aberration B2 by use of the present GUI are described hereinafter with reference to a flow chart shown in FIG. 10. The user of the apparatus pre-set a stop (hereinafter referred to as α) for correction of the X-component of B2, and a stop (hereinafter referred to as β) for correction of the Y-component of B2, respectively, via a text box 912, and a text box 913, respectively, on the GUI. Upon a correction execution button 914 being pushed, the X-component of B2 is corrected by α toward the − direction (step S1). If the X-component of the feature vector becomes smaller (S2), the X-component of B2 is further corrected by α toward the − direction (S3), whereupon step S3 is repeated until the reference sign of the X-component of the feature vector is reversed (S4). Because reversal of the reference sign means that the correction has gone too far, the X-component of B2 is corrected by α toward the + direction (S5).

If the X-component of the feature vector becomes greater after the step S1, there are executed steps S6 to S8 where the reference sign of correction is reversed from the case of the steps S3 to S5. Thus, the X-component of the second-order axial comma aberration B2 is corrected in the step 1 to step 9, and the same procedure is executed as to the Y-component in step 9 to step 16, whereupon the correction of the second-order axial comma aberration B2 is completed.

Further, the reason why it is necessary to determine respective directions in which the X-component of the feature vector, and the Y-component of the feature vector will decrease is because the direction of the feature vector is reversed by about 180 degrees if reversal occurs to the reference sign of a defocus when a Ronchigram is acquired. Accordingly, if the defocus when the Ronchigram is acquired is kept fixed, and respective up-downs in the X-component of the second-order axial comma aberration B2, and the Y-component thereof, corresponding to respective up-downs in the X-component of the feature vector, and the Y-component thereof, are checked in advance, bifurcations in the steps S2, S10, respectively, become unnecessary.

Figure 10:
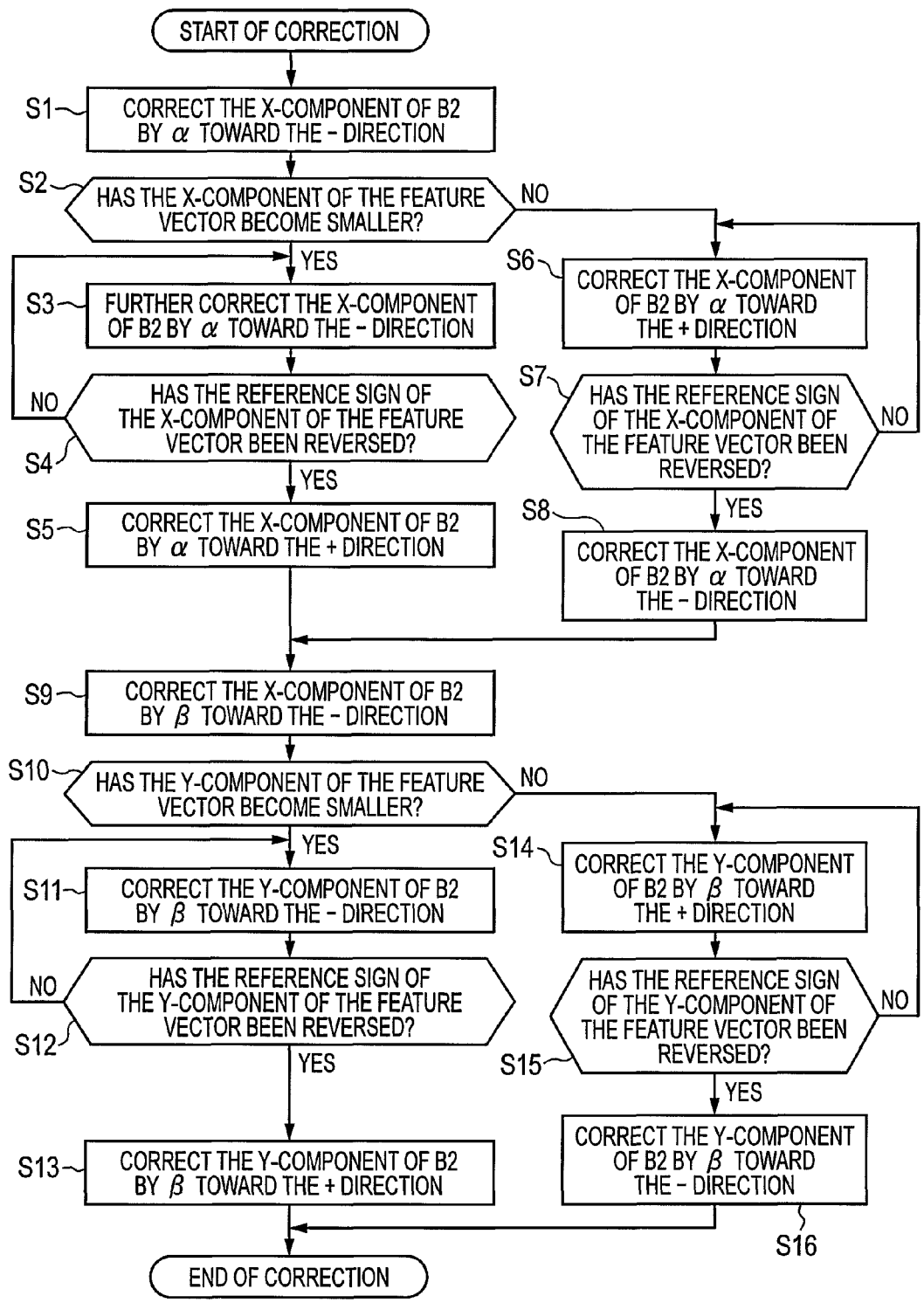
FIG. 10 is a flow chart for use at the time of correcting the second-order axial comma aberration by use of the scanning transmission electron microscope of FIG. 7.
Figure 11A:
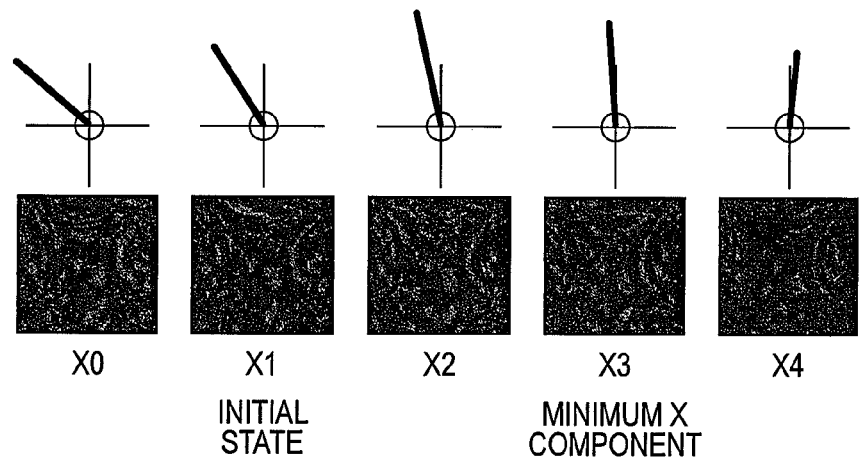
FIG. 11 shows variation in a feature vector and a Ronchigram in one example showing a process of correcting the second-order axial comma aberration on the basis of the GUI shown in FIG. 9.
Figure 11B:
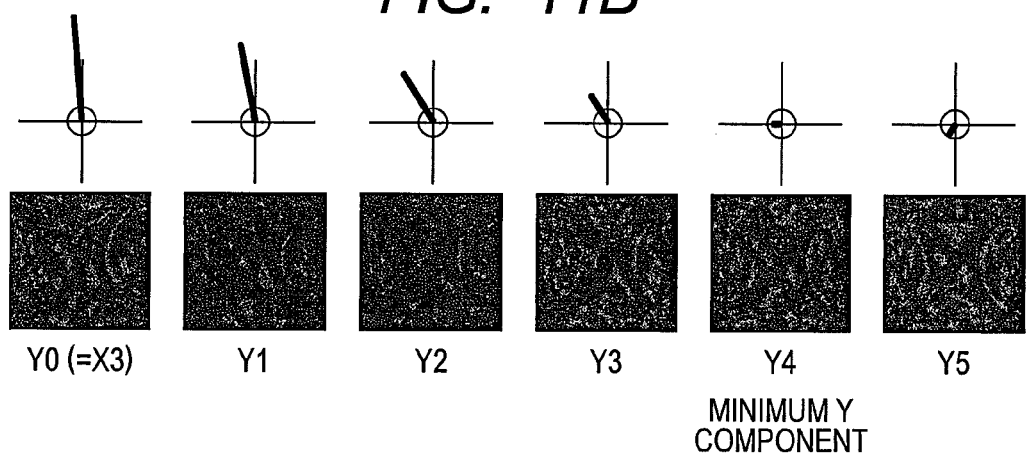

FIGS. 11(a), 11(b) each show variation in the feature vector, and the Ronchigram in one example showing the process of correcting the second-order axial comma aberration B2 on the basis of the flow chart shown in FIG. 10. FIG. 11(a) shows the X-component, and FIG. 11(b) shows the Y-component. X1 in FIG. 11(a) indicates an initial state. If the X-component of B2 is corrected by a (=100 nm) from the initial state toward the − direction, the Ronchigram will be in an X0 state, whereupon the X-component of the feature vector at this point in time will increase toward the − direction. More specifically, this means that a direction for correction was in reverse, and therefore, the X-component of B2 is corrected by α toward the + direction. The X-component of the feature vector is negative in reference sign, decreasing in absolute value up until X3, and at X4, the X-component of the feature vector is reversed to positive in reference sign. Accordingly, it is determined that the X-component of the feature vector has turned to a minimum at X3 one step short of an X4 state, and the X3 state is an initial state Y0 for correction of the Y-component.

Subsequently, if the Y-component of B2 is corrected by $\beta(=100\text{ nm})$ toward the – direction, the Ronchigram will be in a Y1 state, as shown in FIG. 11(b), whereupon the Y-component of the feature vector will decrease. That is, this means that the direction for correction is right, so that the correction of the Y-component of B2 by $\beta$ toward the – direction, as it is, is continued until the reference sign of the Y-component of the feature vector is reversed to negative. It is determined that the Y-component of the feature vector has turned to a minimum at Y4 one step short of a Y5 state where the reference sign of the Y-component of the feature vector is reversed, whereupon the correction of B2 is completed.

Figure 12A:
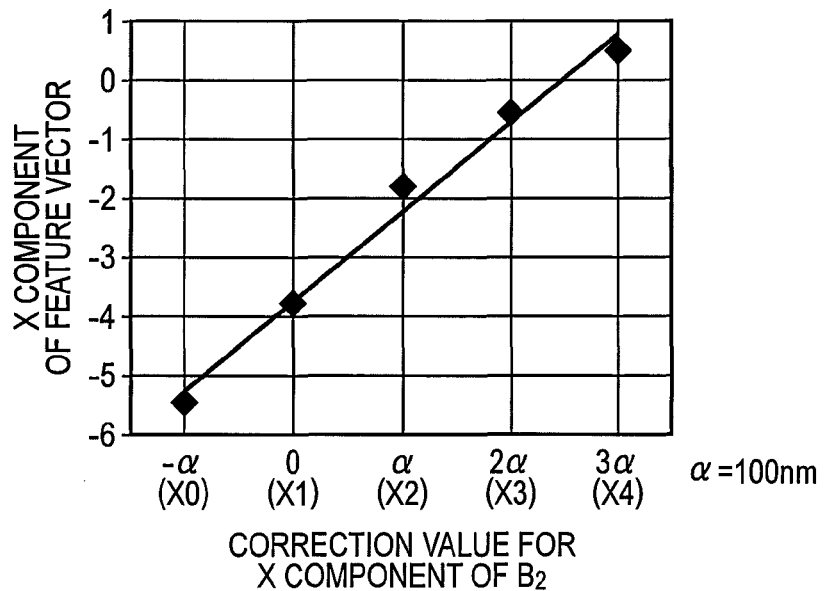
FIG. 12 is a view showing variation in the feature vector shown in FIG. 10, in which (a) shows the X-component of the feature vector, and (b) shows the Y-component of the feature vector.
Figure 12B:
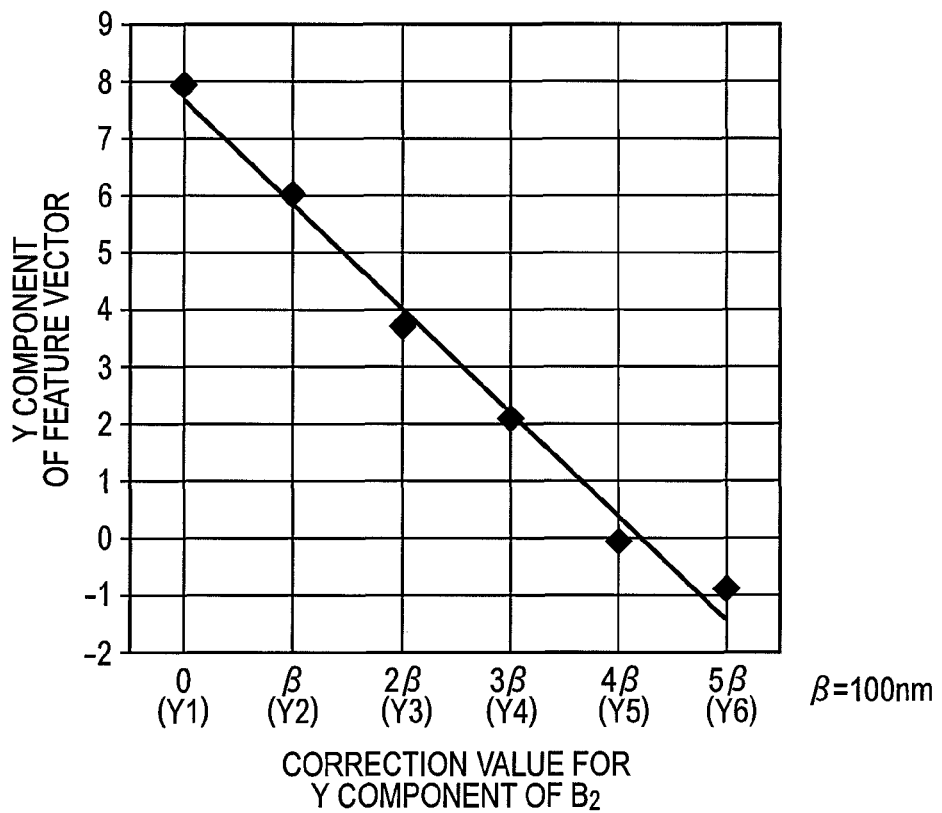

In FIG. 11(a), it has been determined that the X-component of the feature vector has turned to the minimum at the X3 state, however, it appears that the X-component of the feature vector has actually turned to the minimum at about the midpoint between the X3 state and the X4 state. The greater the stop $\alpha$ for correction of the X-component, and the stop $\beta$ for correction of Y-component become, the more pronounced such a gap as described becomes. If variation in respective correction values of the X-component of the feature vector, and the Y-component of the feature vector are plotted against respective correction values of the X-component of B2, and the Y-component of B2, as shown in FIGS. 12(a), 12(b), respectively, and a value on the horizontal axis, corresponding to 0 on the vertical axis, is found by fitting or interpolation (or extrapolation), this problem can be solved.

Figure 13:
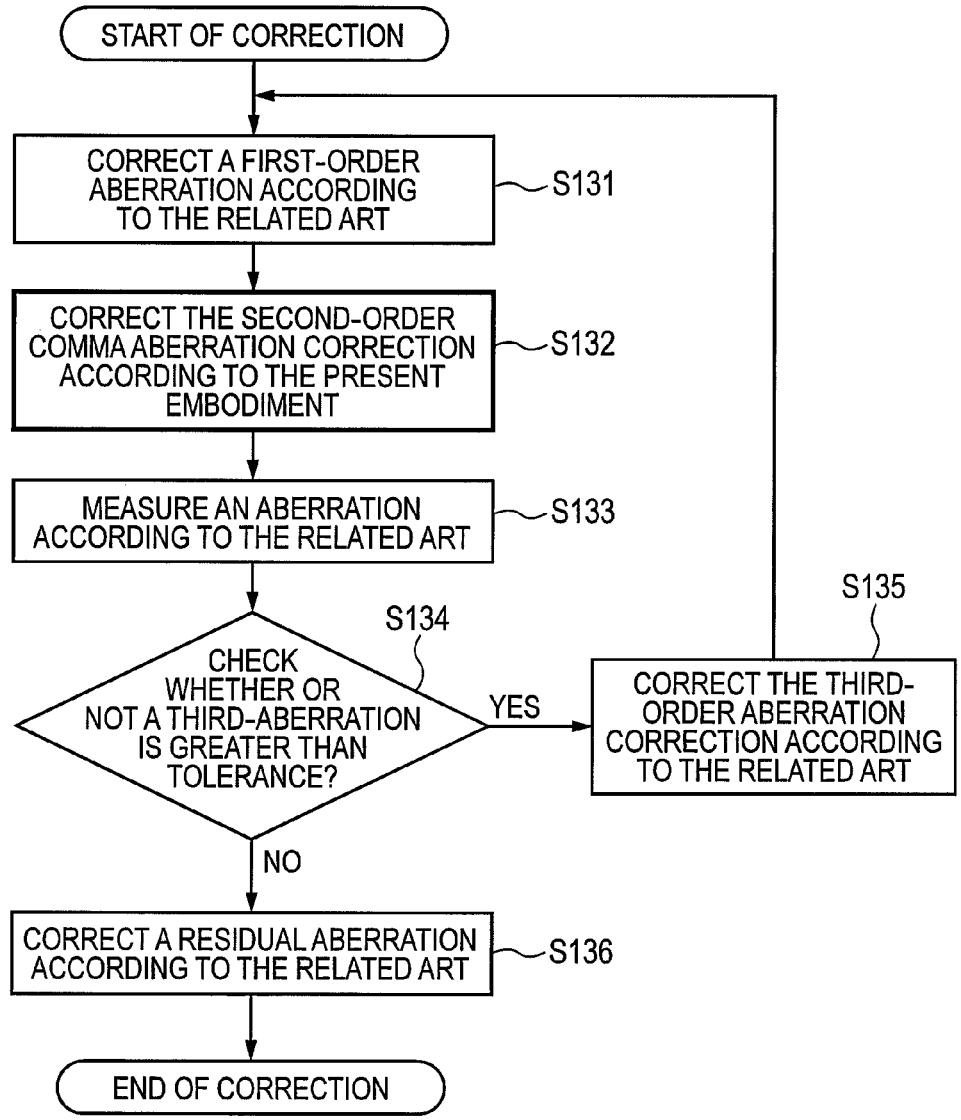
FIG. 13 shows a flow chart for aberration correction.

Next, there is described hereinafter a procedure for correcting all the aberrations in the scanning transmission electron microscope. As for aberration correction, there have so far been carried out first-order aberration correction, second-order comma aberration correction, third-order aberration correction, and residual aberration correction. FIG. 13 is a flow chart of the aberration correction, showing a flow chart in the case where the second-order comma aberration correction according to the present embodiment, and the aberration correction according to the known technology are used in combination with a correction method.

First, in step S131, the first-order aberration correction is executed by a method according to the related art. Subsequently, the second-order comma aberration correction is executed by a method according to the present embodiment (step S132). Subsequently, aberrations are measured by a method according to the related art (step S133), checking whether or not a third-order aberration is greater than tolerance (step S134). If yes, the third-order aberration correction is executed (step S135), and subsequently, the procedure reverts to the step S131, thereby repeating the steps S132, S133. If the third-order aberration is less than tolerance, a residual aberration is corrected by a method according to the related art (step S136), whereupon correction is completed.

In general, a first-order aberration, and a second-order aberration, such as the first-order axial astigmatism A1, and the second-order axial comma aberration B2, in particular, largely occur after the correction of the third-order aberration. Even if aberration measurement is executed with those aberrations in as-left out state, high precision in measurement is not obtainable, it is therefore necessary to correct the first-order axial astigmatism A1, and the second-order axial comma aberration B2 to some extent prior to the aberration measurement. With the present embodiment, a method for quickly correcting the second-order axial comma aberration B2 is provided, and by combining the method with the known technology, an aberration correction process can be quickly completed.

As described in the foregoing, with the present embodiment, the feature vector is made closely analogous to the second-order axial comma aberration, so that it is possible to provide a scanning transmission electron microscope capable of efficiently correcting the second-order axial comma aberration in a short time by making use of the feature vector.

Having described the invention under the present application in detail as above, the principal forms of the invention are listed hereinafter:

(1) A scanning transmission electron microscope comprising a column comprised of an electron beam source, an electron-optical system for irradiating a sample with an electron emitted from the electron beam source, in the form of an electron beam, a detector for detecting the electron beam having passed through the sample, and an aberration corrector for correcting aberrations of the electron-optical system, a control unit for controlling all the constituent elements of the column, and an information processing unit for processing a detection signal of the detector. The information processing unit divides a Ronchigram acquired by the detector into a plurality of segmented areas, a feature vector reflecting both an absolute value and a direction of an off-axial defocus is worked out from an off-axial defocus found in each of the plural segmented areas, and a distance between the center of the Ronchigram and the center of the plural segmented areas.

(2) With the scanning transmission electron microscope described under (1) as above, the sample is an amorphous sample, and the off-axial defocus found in each of the plural segmented areas is approximated to an area of an ellipse, raised to the $(-\frac{1}{2})$-th power, the ellipse expressing a contour line in an intensity distribution of respective autocorrelation functions calculated with respect to the plural segmented areas.

(3) With the scanning transmission electron microscope described under (1) as above, the sample is a particulate sample uniform in size, and the off-axial defocus found in each of the plural segmented areas is approximated to an area of an ellipse, raised to the $(-\frac{1}{2})$-th power, the ellipse expressing a contour line in an intensity distribution of respective autocorrelation functions calculated with respect to the plural segmented areas.

(4) A scanning transmission electron microscope comprising an aberration corrector comprised of a plurality of lenses, an electron-optical system for causing an electron beam to scan on a sample, an aberration of the electron beam being corrected by the aberration corrector, a detector for detecting the electron beam having passed through the sample, and an information processing unit for processing a detection signal of the detector, thereby forming a scanning-transmission electron-beam image, the scanning transmission electron microscope further comprising an image display means for displaying a feature vector reflecting a Ronchigram acquired by the detector, and an absolute value as well as a direction of a second-order axial comma aberration.

(5) With the scanning transmission electron microscope described under (4) as above, a target circle together with the feature vector is displayed by the image display means.

(6) With the scanning transmission electron microscope described under (5) as above, the color of the feature vector falling outside the target circle is changed from the color of the feature vector in the case of the feature vector being within the target circle before the feature vector is displayed.

(7) The scanning transmission electron microscope described under (1) as above, the control unit is connected to an up-down means for increasing or decreasing an X-component as well as a Y-component of a second-order axial comma aberration to control the aberration corrector on the basis of the up-down means, thereby executing correction of the second-order axial comma aberration.

(8) With the scanning transmission electron microscope described under (7) as above, the up-down means increases or decreases the X-component of the second-order axial comma aberration such that an X-component of the feature vector is reduced to a minimum while increasing or decreasing the Y-component of the second-order axial comma aberration such that a Y-component of the feature vector is reduced to a minimum.

(9) With the scanning transmission electron microscope described under (1) as above, the sum of X-components, and the sum of Y-components, with respect to the center coordinates in each of the plural segmented areas, respectively, become zero. (10) The scanning transmission electron microscope described under (9) as above, the plural segmented areas form a 3×3 matrix area, excluding the center (of the Ronchigram).

LIST OF REFERENCE SIGNS

101 . . . objective condenser lens, 102 . . . optical axis, 103 . . . sample plane, 104 . . . image plane, 105 . . . flat contrast area, 201a, 201b, 201c . . . electron beam passing through a lens having no aberration, 202 . . . virtual sample with stripes spaced at equal intervals, 203 . . . sample projection image (with stripes spaced at equal intervals), 204a, 204b . . . passing through a lens with aberrations, 205 . . . sample projection image (intervals between the adjacent stripes are not uniform), 701 . . . column, 702 . . . control unit, 703 . . . information processing unit, 704 . . . display, 705 . . . keyboard, 706 . . . mouse, 707 . . . console for correction of a second-order axial comma aberration, 708 . . . adjusting knob for correction of an X-component of the second-order axial comma aberration, 709 . . . adjusting knob for correction of a Y-component of the second-order axial comma aberration, 801 . . . electron beam source, 802a . . . first stage electric lens, 802b . . . second stage electric lens, 802c . . . third stage electric lens, 803a . . . first stage condenser lens, 803b . . . second stage condenser lens, 804 . . . condenser aperture, 805 . . . aberration corrector, 806a . . . upper stage scan coil, 806b . . . lower stage scan coil, 807 . . . objective condenser lens, 808 . . . sample 809 . . . objective imaging lens, 810 . . . projection lens, 811 . . . alignment coil, 812 . . . dark field image detector, 813 . . . bright field image detector, 814 . . . camera, 901 . . . Ronchigram display, 902 . . . feature vector display, 903 . . . feature vector 904 . . . target circle, 905 . . . text box for setting a target circle radius, 906 . . . label which shows the X-component of the feature vector, 907 . . . label which shows the Y-component of the feature vector, 908 . . . button for correcting an X-component of a second-order axial comma aberration toward the + direction, 909 . . . button for correcting the X-component of the second-order axial comma aberration toward the − direction, 910 . . . button for correcting the Y-component of the second-order axial comma aberration toward the + direction, 911 . . . button for correcting the Y-component of the second-order axial comma aberration toward the − direction, 912 . . . text box for setting a stop for correction of the X-component of the second-order axial comma aberration at the time of Auto-correction, 913 . . . text box for setting a stop for correction of the Y-component of the second-order axial comma aberration at the time of Auto-correction, 914 . . . button for Auto-correction execution

The invention claimed is:

1. A scanning transmission electron microscope comprising:
    a column comprised of an electron beam source, an electron-optical system for irradiating a sample with an electron emitted from the electron beam source, in the form of an electron beam, a detector for detecting the electron beam having passed through the sample, and an aberration corrector for correcting aberrations of the electron-optical system;
    a control unit for controlling all the constituent elements of the column; and
    an information processing unit for processing a detection signal of the detector,
    wherein the information processing unit divides a Ronchigram acquired by the detector into a plurality of segmented areas, a feature vector reflecting both an absolute value and a direction of an off-axial defocus is worked out from an off-axial defocus found in each of the plural segmented areas, and a distance between the center of the Ronchigram and the center of the plural segmented areas.

2. The scanning transmission electron microscope according to claim 1, wherein the sample is an amorphous sample, and the off-axial defocus found in each of the plural segmented areas is approximated to an area of an ellipse, raised to the (−½)-th power, the ellipse expressing a contour line in an intensity distribution of respective autocorrelation functions calculated with respect to the plural segmented areas.

3. The scanning transmission electron microscope according to claim 1, wherein the sample is a particulate sample uniform in size, and the off-axial defocus found in each of the plural segmented areas is approximated to an area of an ellipse, raised to the (−½)-th power, the ellipse expressing a contour line in an intensity distribution of respective autocorrelation functions calculated with respect to the plural segmented areas.

4. The scanning transmission electron microscope according to claim 1, further comprising:
    an image display means for displaying the feature vector reflecting a Ronchigram acquired by the detector, and an absolute value as well as a direction of a second-order axial comma aberration.

5. The scanning transmission electron microscope according to claim 4, wherein a target circle together with the feature vector is displayed by the image display means.

6. The scanning transmission electron microscope according to claim 5, wherein the color of the feature vector falling outside the target circle is changed from the color of the feature vector in the case of the feature vector being within the target circle before the feature vector is displayed.

7. The scanning transmission electron microscope according to claim 1, wherein the control unit is connected to an up-down means for increasing or decreasing an X-component as well as a Y-component of a second-order axial comma aberration to control the aberration corrector on the basis of the up-down means, thereby executing correction of the second-order axial comma aberration.

8. The scanning transmission electron microscope according to claim 7, wherein the up-down means increases or decreases the X-component of the second-order axial comma aberration such that an X-component of the feature vector is reduced to a minimum while increasing or decreasing the Y-component of the second-order axial comma aberration such that a Y-component of the feature vector is reduced to a minimum.

9. The scanning transmission electron microscope according to claim 1, wherein the sum of X-components, and the sum of Y-components, with respect to the center coordinates in each of the plural segmented areas, respectively, become zero.

10. The scanning transmission electron microscope according to claim 9, wherein the plural segmented areas form a 3×3 matrix area, excluding the center (of the Ronchigram).

* * * * *